United States Patent [19]

Nezu et al.

[11] 4,188,222

[45] Feb. 12, 1980

[54] PHOTOCURABLE COMPOSITION CONTAINING AN N-NITROSODIARYLAMINE

[75] Inventors: Tuguo Nezu; Nobuyoshi Miyata, both of Hiratsuka, Japan

[73] Assignee: Kansai Paint Co., Ltd., Japan

[21] Appl. No.: 613,625

[22] Filed: Sep. 15, 1975

[30] Foreign Application Priority Data

Sep. 17, 1974 [JP] Japan ............................. 49-106013

[51] Int. Cl.$^2$ .............................................. G03C 1/68
[52] U.S. Cl. ............................... 430/284; 204/159.18; 204/159.23; 204/159.24; 430/288; 917
[58] Field of Search ............... 204/159.18, 159.19, 204/159.23; 96/115 P, 115 R

[56] References Cited

U.S. PATENT DOCUMENTS

| | | | |
|---|---|---|---|
| 3,203,801 | 8/1965 | Heiart | 204/159.23 |
| 3,267,132 | 8/1966 | Newsom | 260/465.9 |
| 3,615,629 | 10/1971 | Wilhelm et al. | 96/115 R |
| 3,619,392 | 11/1971 | Metzner et al. | 204/159.23 |
| 3,853,728 | 12/1974 | Wrzesinski | 204/159.23 |
| 3,885,964 | 5/1975 | Nacci | 96/35.1 |
| 3,901,705 | 8/1976 | Pazos | 96/35.1 |

OTHER PUBLICATIONS

Condensed Chem. Dictionary, Sixth Ed., pp. 807–808, (1961).
Tyudesh et al., *Kinetics and Catalysts*, 6, 175–181, (1965).

*Primary Examiner*—Jack P. Brammer
*Attorney, Agent, or Firm*—Ostrolenk, Faber, Gerb & Soffen

[57] ABSTRACT

A photocurable composition comprising a major part of a polymerizable compound with at least two ethylenically unsaturated bonds in one molecule thereof, and minor parts of a photosensitizer and a nitrosodiarylamine compound is described. The nitrosodiarylamine compound serves to suppress thermal polymerization of the photocurable composition. The photocurable composition is especially suitable for use in making paints and printing plate materials.

10 Claims, No Drawings

PHOTOCURABLE COMPOSITION CONTAINING AN N-NITROSODIARYLAMINE

This invention relates to a photocurable composition which is almost free from thermal polymerization, especially that taking place naturally at a normal temperature, and which has a very excellent stability to thermal polymerization or to storage.

Photocurable or photosensitive compositions which include a polymerizable ethylenically unsaturated compound as main component and a photosensitizer for increasing a rate of photopolymerization have been widely used in the field of paints, printing plate materials, etc., where it is essential to subject the compositions to a curing treatment by irradiation of actinic rays. The unsaturated compound which is generally susceptible to polymerization under thermal conditions has a possibility of being undesirable exposed to high temperature conditions since the same is often prepared by chemical reaction at high temperature, and is sometimes subjected to a strong mechanical shearing treatment in a step such as of kneading upon preparation of a photocurable composition using the unsaturated compound. Further, the unsaturated compound tends to be naturally thermally polymerized during storage even at a normal temperature. As a consequence, the viscosity of the unsaturated compound or the photocurable composition is increased to such an extent that it is difficult to use, resulting in gelation in the worst case. In order to overcome the difficulty, it is general to add to the photocurable composition, a free radical polymerization inhibitor such as hydroquinone, p-benzoquinone, p-methoxyphenol, pyrogallol, tert-butylcatechol, β-naphthol, 3,5-tert-butylhydroxytoluene (hereinafter referred to as BHT), 2,2'-dimethyl-5,5'-di-tert-butyl-4,4'-dihydroxyphenyl thioether (hereinafter referred to as WXR), 2,6-di-tert-butyl-4-methylphenol or the like. The addition of the polymerization inhibitor makes it possible to effect the preparation process smoothly and to prolong a period of storage time at a normal temperature.

However, when the known free radical polymerization inhibitor is added to a photocurable composition in an amount sufficient to completely suppress thermal polymerization or in such an amount as to prolong a period of storing time in a practically satisfactory manner, the photopolymerization reaction (or photocurability) is also suppressed, disadvantageously, requiring an increased intensity of actinic radiation or a prolonged period of irradiation time.

It is therefore an object of the present invention to provide a photocurable composition which overcomes the difficulties or disadvantages of the conventional photocurable compositions.

It is another object of the present invention to provide a photocurable composition which is excellent in storage stability or resistance to thermal polymerization and in photosensitivity.

It is a further object of the present invention to provide a photocurable composition which is utilizable in the form of a solution or a solid.

It is another object of the present invention to provide a photocurable composition which can stand use even when treated under severe kneading conditions, so that a homogeneous solid composition is obtained.

The above and related objects are attained by providing a photocurable composition which comprises as its main component a photopolymerizable compound having at least two ethylenically unsaturated bonds in one molecule thereof, a photosensitizer, and an N-nitrosodiarylamine compound expressed by a general formula

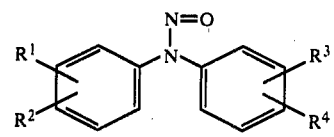

(wherein $R^1$ and $R^2$ are independently hydrogen, an alkyl group containing 1-3 carbon atoms, a phenyl group, a halogen atom, a methoxy group, an ethoxy group, a dimethylamino group or a diethylamino group, and $R^3$ and $R^4$ are independently hydrogen, an alkyl group containing 1-9 carbon atoms, a cyclohexyl group, a phenyl group, a halogen atom, a methoxy group, an ethoxy group, a dimethylamino group or a diethylamino group).

The nitrosodiarylamine compound expressed by the above-mentioned general formula in which all of $R^1$, $R^2$, $R^3$ and $R^4$ are a hydrogen atom is N-nitrosodiphenylamine. As well known in the art, N-nitrosodiphenylamine is widely employed in a vulcanizing step of rubber to prevent a prevulcanization phenomenon, i.e., prior to a molding operation, a cross-linking reaction takes place in a kneading step due to generation of heat, making it difficult to handle. However, it is not known at all that N-nirosodiphenylamines serves to suppress or prevent thermal polymerization, particularly at a normal temperature, of such an ethylenically unsaturated compound as used in the composition of the present invention, which thermal polymerization is completely different from the vulcanization reaction of rubber molecules at high temperatures by means of sulfur or an organic peroxide. Further, it is surprising that the N-nitrosodiarylamine compounds hardly impede photopolymerization of the photocurable composition, in spite of their remarkable effects in preventing thermal polymerization. The reason for this is not known at the present stage of our investigation but it is assumed that the chemical structures of these compounds are converted into deactivated ones by irradiation of actinic rays.

The photocurable composition of the invention comprises as its main component a polymerizable compound having at least two ethylenically unsaturated bonds in one molecule thereof (hereinafter referred to simply as "poly-unsaturated compound"). In this connection, a photocurable composition using as its main component a polymerizable compound alone having only one ethylenically unsaturated bond is low in photocurability and unsuitable for use as paints, printing plate materials and the like which require a photopolymerization step in application, so that the addition of an N-nitrosodiarylamine compound to such composition gives little profit.

Typical of the polyunsaturated compounds are: divinylbenzene; diacrylates, dimethacrylates and dicrotonates of dihydric alcohols such as ethylene glycol, propylene glycol, 1,4-butanediol, 1,6-hexanediol, diethylene glycol, polyethylene glycol, polypropylene glycol, neopentyl glycol and the like; and addition product obtained by 1 mole of an epoxy resin (e.g., a polycondensate of bisphenol A and epichlorohydrin) and 2 moles of acrylic acid, methacrylic acid or crotonic acid; an ester of 1 mole of a trihydric alcohol such as glycerine, trimethylolethane, trimethylolpropane or the like and 2–3 moles of a crylic acid, methacrylic acid or crotonic acid; an ester of 1 mole of a tetrahydric alcohol such as pentaerythritol and 2–4 moles of acrylic acid, methacrylic acid or crotonic acid; a diurethane compound obtained by addition reaction of 1 mole of a diisocyanate compound such as hexamethylenediisocyanate, phenylenediisocyanate, tolylenediisocyanate, xylenediisocyanate or isophorondiisocyanate with 2 moles of 2-hydroxyethyl (or hydroxypropyl) acrylate (or methacrylate); a polyurethane compound obtained by addition reaction of 1 mole of a dihydric alcohol, 2 moles of a diisocyanate such as the same mentioned above and 2 moles of 2-hydroxyethyl (or hydroxypropyl) acrylate (or methacrylate); an unsaturated polyester containing 2 equivalents or greater of a residue of an unsaturated dicarboxylic acid such as maleic acid, fumaric acid or itaconic acid per mole of the unsaturated polyester on a number average molecular weight; an addition product of 1 mole, on a number average molecular weight basis, of an acrylic resin which contains greater than 2 moles, inclusive, of glycidylacrylate or glycidylmethacrylate as a copolymerized component and of 2 moles or greater of acrylic acid or methacrylic acid; an addition product of 1 mole, on a number average molecular weight basis, of an acrylic resin which contains 2 moles or greater of acrylic acid or methacrylic acid as a copolymerized component and of 2 moles or greater of glycidylacrylate or glycidylmethacrylate; a diallyl ester such as diallyl phthalate, diallyl maleate or the like; and methylenebisacrylamide.

Particularly preferable are an addition product obtained by 1 mole of an epoxy resin (e.g., a polycondensate of bisphenol A and epichlorohydrin) and 2 moles of acrylic acid, methacrylic acid or crotonic acid; an ester of 1 mole of a trihydric alcohol such as glycerine, trimethylolethane, trimethylolpropene or the like and 2–3 moles of acrylic acid, methacrylic acid or crotonic acid; an ester of 1 mole of a tetrahydric alcohol such as pentaerythritol and 2–4 moles of acrylic acid, methacrylic acid or crotonic acid; a diurethane compound obtained by addition reaction of 1 mole of a diisocyanate compound such as hexamethylenediisocyanate, phenylenediisocyanate, tolylenediisocyanate, xylenediisocyanate or isophorondiisocyanate with 2 moles of 2-hydroxyethyl (or hydroxypropyl) acrylate (or methacrylate); a polyurethane compound obtained by addition reaction of 1 mole of a dihydric alcohol, 2 moles of a diisocyanate such as the same mentioned above and 2 moles of 2-hydroxyethyl (or hydroxypropyl) acrylate (or methacrylate); an unsaturated polyester containing 2 equivalents or greater of a residue of an unsaturated dicarboxylic acid such as maleic acid, fumaric acid or itaconic acid per mole of the unsaturated polyester on a number average molecular weight; Other known poly-unsaturated compounds capable of free radical polymerization may be also employed without limitation in the present invention. Furthermore, the poly-unsaturated compound may be mixed with a mono-unsaturated compound such as styrene, acrylic acid esters or methacrylic acid esters of monohydric alcohols or the like, the latter being used in an amount not exceeding five times (by weight) as large as that of the former.

The photosensitizer may be any compounds which are employed as a photosensitive component of known photopolymerizable compositions, exhibiting an excellent photosensitivity for assuring a free radical polymerization by actinic light, and which are miscible with the above-mentioned poly-unsaturated compound, and includes, for example, α-carbonyl alcohols such as benzoin, acyloin ethers such as benzoin methyl ether, α-substituted acyloin ethers such as α-methylbenzoin, polynuclear quinones such as 9,10-anthraquinone, neighboring polyketones such as diacetyl, disulfides such as diphenyl disulfide, phenyl ketones such as benzophenone, and azo compounds such as 1,1'-azobiscyclohexanecarbonitrile. These compounds are generally used in an amount of 0.001–5% by weight of the photocurable composition.

As indicated hereinbefore, the N-nitrosodiarylamine compounds which are contained in the photocurable composition of the invention for imparting thereto a resistance or stability to thermal polymerization are expressed by the following general formula

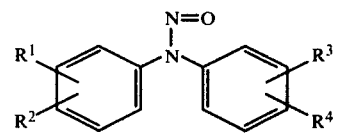

In the general formula, $R^1$, $R^2$, $R^3$ and $R^4$ vary depending on the kind of a substituent of a nuclear substituted arylmonoamine, a nuclear substituted monohydric phenol or a nuclear substituted monoaryl halide which is a starting material for preparation of a diarylamine prior to a nitroso treatment thereof. More particularly, $R^1$ and $R^2$ are independently hydrogen, an alkyl group having 1–3 carbon atoms, a phenyl group, a halogen atom, a methoxy group, an ethoxy group, a dimethylamino group or a diethylamino group, and $R^3$ and $R^4$ are independently hydrogen an alkyl group having 1–9 carbon atoms, a cyclohexyl group, a phenyl group, a halogen atom, a methoxy group, an ethoxy group, a dimethylamino group or a diethylamino group. Examples of the N-nitrosodiarylamine compounds useful in the present invention include N-nitrosodiphenylamine, N-nitroso-3,3'-dimethyldiphenylamine, N-nitroso-4,4'-diisopropyl-diphenylamine, N-nitroso-3,3',5,5'-tetramethyl-diphenylamine, N-nitroso-4,4'-diphenyl-diphenylamine, N-nitroso-4,4'-dichloro-diphenylamine, N-nitroso-2,2'-dimethoxy-diphenylamine, N-nitroso-4,4'-diethoxydiphenylamine, N-nitroso-4,4'-di-dimethylamino-diphenylamine, N-nitroso-4,4'-di-diethylamino-diphenylamine, N-nitroso-4-tert-butyl-diphenylamine, N-nitroso-4-nonyl-diphenylamine, N-nitroso-4-cyclohexyl-diphenylamine, n-nitroso-4-methoxydiphenylamine, N-nitroso-4-ethoxy-diphenylamine, and N-nitroso-4'-ethoxy-2-methyl-diphenylamine. These N-nitrosodiarylamines are generally employed in the range of 0.001–1% by weight, preferably 0.003–0.1% by weight, of the photocurable composition. Within the above range, the amount of the N-nitrosodiarylamine should be suitably determined in consideration of heat history in the preparation and processing steps, required period of storage time, and the kind and amount of a phososensitizer. If the N-nitrosodiarylamine is used in the amount of more than 1% by weight, the resulting coating film or printing plate has poor mechanical properties such as tensile strength. Conversely, with the use of less than 0.001% by weight the desired effects are not obtainable. When a prolonged period of storage time is especially required, the afore-mentioned known free radical polymerization inhibitor is added to the high temperature chemical reaction system during preparation of the poly-unsaturated compound in such a small amount as not to cause any hindrance with regard to suppression of the photopolymerization. After completion of the reaction, an N-nitrosodiarylamine compound is further added to the resultant poly-unsaturated compound. Alternatively, an N-nitrosodiarylamine may be added to the reaction system from the beginning together with a known free radical polymerization inhibitor.

The photocurable composition of the present invention is far superior in photopolymerization property to conventional photocurable compositions, so that even when the light transmittance of the photocurable composition is reduced due to dispersion of a coloring pigment or a filler in the composition, the composition can be hardened without hindrance by means of actinic rays. The photocurable composition of the invention may be used in the form of a solution with a low viscosity by adding thereto a volatile organic solvent or may be employed in the form of a solid by mixing therewith a solid high molecular material such as a cellulose derivative for example, cellulose acetate phthalate, cellulose acetate succinate, cellulose propionate maleate, cellulose acetate butyrate, hydroxypropylmethyl cellulose phthalate, etc., a polyvinyl alcohol derivative for example, polyvinylbutyral resin, an acrylic resin, an epoxy resin, a saturated polyester, polyvinyl chloride, polystyrene, polyamide or the like in an amount of about 20 to 60% by weight of the photocurable composition.

In order to avoid delay of surface hardening of the photocurable composition upon curing by irradiation of actinic rays, an air-shutting-off layer forming component such as of paraffin wax may be added to the photocurable composition of the invention, if necessary, in an amount of about 0.05 to 2% by weight of the photocurable composition.

The poly-unsaturated compound which constitutes a major part of the photocurable composition of the invention can be prepared even under severe heating conditions of high temperature and a long period of heating time. As a result, it is relatively easy to obtain a poly-unsaturated compound with high degree of unsaturation, the photocurable composition using such highly unsaturated compound being remarkably improved in photopolymerizing property. In addition, the poly-unsaturated compound with high degree of unsaturation may be kneaded under severe conditions, so that it is possible to obtain a solid photocurable composition with excellent uniformity. The photocurable composition of the invention is free from change in quality even when stored at a normal temperature over a long period of time. In case where it is not required to store the photocurable composition over a long time, a time required for actinic radiation can be reduced by far when compared with those required in known photocurable compositions.

The present invention will be particularly illustrated by way of the following Examples, which should not be construed as limiting thereto the present invention.

EXAMPLE 1

5 moles of maleic anhydride, 5 moles of phthalic anhydride, and 10.5 moles of propylene glycol were introduced into a reactor for condensation at 180°-200° C. for about 5 hours to obtain an unsaturated polyester with an acid value of about 28. The thus obtained unsaturated polyester was dissolved in styrene in a ratio of 3:2. The styrene employed was a commercially available product which had been purified by a usual method for removing the previously added thermal polymerization inhibitor therefrom and then freshly added with 200 ppm of N-nitrosodiphenylamine. Thereafter, the resultant solution was added with 1% by weight of benzoin ethyl ether used as a photosensitizer and with 0.1% by weight of paraffin wax to obtain a photocurable composition with a viscosity of about 15 poises.

The photocurable composition was subjected to storage tests, no change in quality being recognized 30 days after the accelerated storage test at 40° C. and 6 months after the storage test at room temperature. Further, the photocurable composition was applied onto a metal plate in a film thickness of about 100μ and exposed to an ultra-violet ray for 2 min by means of a low pressure mercury lamp (Model FL-20BL produced by Tokyo Shibaura Electric Co. Ltd., Japan) at a distance of 20 cm from the film. As a result, the film was completely cured or hardened.

COMPARATIVE EXAMPLE 1

Example 1 was repeated using the following three kinds of styrenes A, B and C for preparation of three kinds of photocurable compositions: styrene A was a commercially available product containing therein 100 ppm of hydroquinone as a thermal polymerization inhibitor; styrene B was the styrene A from which hydroquiquinone was removed by an ordinary method, followed by distillation and purification; and styrene C was the styrene B to which was added 100 ppm of 2,6-di-ter-butyl-4-methylphenol as a thermal polymerization inhibitor.

The three kinds of the photocurable compositions using the three kinds of styrenes, respectively, were each subjected to an accelerated storage test and a light irradiation test in the same manner as in Example 1 to obtain the results of Table 1 below. The viscosities of the three kinds of the photocurable compositions obtained immediately after the preparation were almost the same as that of the photocurable composition of Example 1.

Table 1

| Kind of styrene | Time required for curing by actinic light (min) | Accelerated storage test (at 40° C. and after a lapse of 30 days) |
| --- | --- | --- |
| A | 15 | Viscosity was raised up to 100 poises. |
| B | 2 | Gelation |
| C | 10 | Viscosity was raised up to 80 poises. |

EXAMPLE 2-13 and Comparative Examples 2-4

To trimethylolpropane trimethacrylate (produced by Shin Nakamura Chemical Ind. Co., Ltd. in the commercial name of "NK Ester TMPT" and containing 60 ppm of hydroquinone monomethyl ether) was added 1% by weight of benzophenone for making the trimethacrylate photopolymerizable. Then, various kinds of N-nitrosodiarylamine compounds which had, as nuclear substituens $R^1$, $R^2$, $R^3$ and $R^4$, the respective atomic groups as indicated in Table 2 were added to the trimethacrylate each in an amount of 60 ppm to obtain photocurable samples of Examples 2-13, respectively.

These samples were subjected to photopolymerization and storage stability tests in comparison with three kinds of photocurable compositions wherein BHT and WXR were employed as a thermal polymerization inhibitor instead of the N-nitrosodiarylamine compound in an amount of 60 ppm, respectively, and no thermal polymerization inhibitor was used (Comparative Examples 2–4).

The photopolymerization test was effected as follows: the respective samples were ech placed in a Petri dish in a thickness of 1 mm, which was then exposed to light in a flow of nitrogen gas at a distance of 30 cm from the sample layer by the use of a high pressure mercury lamp ("Model UMH-3000" produced by Ushio Electric Co., Ltd.) to determine a time required before the sample gelled. Further, the test samples were each filled in a test tube and allowed to stand in a room at 40° C. in an open state to determine the number of storable days until the sample did not show any fluidity. The test results are shown in Table 2 below.

Then, the two photocurable relief printing plates were exposed to an ultra-violet ray of the low pressure mercury lamp of Example 1 through the same lithfilm at a distance of 10 cm from the film, respectively. As a result, with the photocurable relief printing plate using N-nitrosophenylamine, it was possible to develop it by means of a 0.2% NaOH aqueous solution 3 minutes after the exposure and the resultant printed matter was excellent in sharpness. The printing plate using p-benzoquinone required an exposure of 12 minutes and was inferior in sharpness of the printed matter to the former due to formation of undesirable thick image lines.

With regard to the storage stability at 30° C., even 60 days after commencement of the storage test, the composition of the invention had almost the same developing property and sharpness of the printed matter as that obtained immediately after the preparation, while 35 days after the preparation, the benzoquinone was impossible to use due to gelation.

What is claimed is:

Table 2

| Example No. | Thermal polymerization inhibitor added | | | | Gelation time (min) | Storable days (days) |
|---|---|---|---|---|---|---|
| | $R^1$ | $R^2$ | $R^3$ | $R^4$ | | |
| 2 | H | H | H | H | 2.6 | 30 |
| 3 | 3-metyl | H | 3'-methyl | H | 2.7 | 33 |
| 4 | 3-methyl | 5-methyl | 3'-methyl | 5'-methyl | 2.7 | 35 |
| 5 | 4-phenyl | H | 4'-phenyl | H | 2.6 | 32 |
| 6 | 4-chloro | H | 4'-chloro | H | 2.7 | 30 |
| 7 | 2-methoxy | H | 2'-methoxy | H | 2.7 | 22 |
| 8 | 4-dimethyl-amino | H | 4'-dimethyl-amino | H | 2.6 | 34 |
| 9 | 4-tert-butyl | H | H | H | 2.7 | 34 |
| 10 | 4-nonyl | H | H | H | 2.6 | 20 |
| 11 | 4-cyclo-hexyl | H | H | H | 2.6 | 20 |
| 12 | 4-methoxy | H | H | H | 2.7 | 27 |
| 13 | 2-methyl | H | 4'-ethoxy | H | 2.7 | 29 |
| Comparative Example No. | | | | | | |
| 2 | | | nil | | 2.5 | 3 |
| 3 | | | BHT | | 2.8 | 13 |
| 4 | | | WXR | | 3.0 | 8 |

EXAMPLE 14 and Comparative Example 5

360 g (2.06 moles) of tolylenediisocyanate was mixed with 400 g (1.0 mole) of polyethylene glycol with a number average molecular weight of 400 for reaction at 140° C. for 30 min, and cooled. To the reaction solution was added 260 g (2 moles) of 2 hydroxyethyl methacrylate, in which 0.21 g of N-nitrosodiphenylamine (Example 14) or p-benzoquinone (Comparative Example 5) was dissolved, for reaction at 40° C. for 24 hours to obtain an unsaturated acrylic urethane resin in the form of a viscous liquid at room temperature. 50 parts (by weight) of the resin was mixed with 50 parts (by weight) of cellulose acetate phthalate and 1 part (by weight) of benzoin ethyl ether, and the resulting mixture was kneaded for 30 min by means of a pair of hot rolls with a surface temperature of 120° C. to make the mixture uniform. The uniform mixture was applied onto a metal plate which had been previously coated with an adhesive for forming a 0.6 mm thick layer on the metal plate by pressmolding to obtain a photocurable relief printing material. Similarly, the other photocurable relief printing plate was obtained.

1. A photocurable composition comprising a major part of a photopolymerizable compound having at least two ethylenically unsaturated bonds in one molecule thereof, a minor part of a photosensitizer and 0.001–1.0% of an N-nitrosodiarylamine expressed by the formula

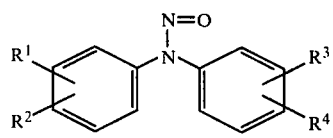

(wherein $R^1$ and $R^2$ are independently hydrogen, an alkyl group having 1–3 carbon atoms, a phenyl group, a halogen atom, a methoxy group, an ethoxy group, a dimethylamino group or a diethylamino group, and $R^3$ and $R^4$ are independently hydrogen, an alkyl group having 1–9 carbon atoms, a cyclohexyl group, a phenyl group, a halogen atom, a methoxy group, an ethoxy group, a dimethylamino group or a diethylamino group).

2. A photocurable composition according to claim 1, wherein said photopolymerizable compound is selected from the group consisting of: divinylbenzene; a diacrylate, a dimethacrylate and a dicrotonate of ethylene glycol, propylene glycol, 1,4-butanediol, 1,6-hexanediol, diethylene glycol, polyethylene glycol or neopentyl glycol; an addition product of 1 mole of an epoxy resin and 2 moles of acrylic acid, methacrylic acid or crotonic acid; an ester of 1 mole of glycerine, trimethylolethane or trimethylolpropane and 2–3 moles of acrylic acid, methacrylic acid or crotonic acid; an ester of 1 mole of pentaerythritol and 2–4 moles of acrylic acid, methacrylic acid or crotonic acid; a diurethane compound obtained by addition reaction of 1 mole of a diisocyanate with 2 moles of 2-hydroxyethylacrylate, 2-hydroxymethacrylate, hydroxypropyl acrylate or hydroxypropylmethacrylate; a polyurethane compound obtained by addition reaction of 1 mole of a dihydric alcohol, 2 moles of a diisocyanate and 2 moles of 2-hydroxyethylacrylate, 2-hydroxyethylmethacrylate, hydroxypropylacrylate, or hydroxypropylmethacrylate; an unsaturated polyester containing 2 equivalents or more of a residue of maleic acid, fumaric acid, fumaric acid or itaconic acid per mole thereof based on its number average molecular weight; an addition product of 1 mole, on a number average molecular weight basis, of an acrylic resin which contains greater than 2 moles, inclusive, of glycidylacrylate or glycidylmethacrylate as a copolymerized component and of 2 moles or greater of acrylic acid or methacrylic acid; an addition product of 1 mole, on a number average molecular weight basis, of an acrylic resin which contains 2 moles or greater of acrylic acid or methacrylic acid as a copolymerized component and 2 moles or greater of glycidylacrylate or glycidylmethacrylate; a diallyl ester consisting of diallyl phthalate and diallyl maleate; and methylenebisacrylamide.

3. A photocurable composition according to claim 1, wherein said photosensitizer is used in an amount of 0.001–5% by weight of said composition.

4. A photocurable composition according to claim 1, wherein said N-nitrosodiarylamine compound is selected from the group consisting of N-nitrodiphenylamine, N-nitroso-3,3'-dimethyl-diphenylamine, N-nitroso-4,4'-diisopropyl-diphenylamine, N-nitroso-3,3',5,5'-tetramethyl-diphenylamine, N-ditroso-4,4'-diphenyl-diphenylamine, N-nitroso-4,4'-dichloro-diphenylamine, N-nitroso-2,2'-dimethoxy-diphenylamine, N-nitroso-4,4'-diethoxydiphenylamine, N-nitroso-4,4'-di-diethylamino-diphenylamine, N-nitroso-4,4'-di-diethylamino-diphenylamine, N-nitroso-4-tert-butyl-diphenylamine, N-nitroso-4-nonyl-diphenylamine, N-nitroso-4-cyclohexyl-diphenylamine, N-nitroso-4-ethoxy-diphenylamine, N-nitroso-4-ethoxy-diphenylamine and N-nitroso-4'-ethoxy-2-methyldiphenylamine.

5. A photocurable composition according to claim 1, wherein said N-nitrosodiarylamine is used in an amount of 0.003–0.1% by weight of said photocurable composition.

6. A photocurable composition according to claim 1, further comprising a solid high molecular material which is miscible with said photocurable composition and which is selected from the group consisting of cellulose derivatives, polyvinyl alcohol derivatives, acrylic resin, epoxy resin, saturated polyester, polyvinyl chloride, polystyrene, and polyamide.

7. A photocurable composition according to claim 1, further comprising paraffin wax (in an amount of 0.05 to 2% by weight of said composition) whereby a surface layer of said composition, when applied, is hardened without delay upon actinic radiation.

8. A photocurable composition according to claim 1, wherein said photopolymerizable compound is a mixture of compounds with one ethylenically unsaturated bond and with at least two ethylenically unsaturated bonds, the former being used in an amount not exceeding five times as large as that of the latter on the a weight basis.

9. A photocurable composition according to claim 8, wherein the compound with one ethylenically unsaturated bond is selected from the group consisting of styrene, and acrylic acid esters and methacrylic acid esters of monohydric alcohols.

10. A photocurable composition according to claim 1 wherein $R^1$, $R^2$, $R^3$ and $R^4$ are each hydrogen.

* * * * *